United States Patent [19]

Steele et al.

[11] Patent Number: 5,302,865
[45] Date of Patent: Apr. 12, 1994

[54] HIGH-SPEED COMPARATOR LOGIC FOR WIDE COMPARES IN PROGRAMMABLE LOGIC DEVICES

[75] Inventors: Randy C. Steele, Folsom; Richard P. Vireday, Cameron Park, both of Calif.

[73] Assignee: Intel Corporation, Santa Clara, Calif.

[21] Appl. No.: 17,851

[22] Filed: Feb. 16, 1993

[51] Int. Cl.$^5$ .................. H03K 19/173; G06F 7/38
[52] U.S. Cl. .................. 307/465; 340/146.2; 364/716
[58] Field of Search ............ 307/465; 340/146.2; 364/716

[56] References Cited

U.S. PATENT DOCUMENTS

| | | | |
|---|---|---|---|
| 4,348,737 | 9/1982 | Cakier et al. | 307/465 |
| 4,536,738 | 8/1985 | Huse et al. | 340/146.2 |
| 4,799,152 | 1/1989 | Chuang et al. | 340/146.2 |
| 5,059,942 | 10/1991 | Burrows | 340/146.2 |
| 5,224,072 | 6/1993 | Matsubara | 307/465 |

Primary Examiner—Edward P. Westin
Assistant Examiner—Richard Roseen
Attorney, Agent, or Firm—Owen L. Lamb

[57] ABSTRACT

A programmable gate array comprised of a number of configurable functional blocks. Each configurable functional block has a number (m) of inputs. A global interconnect matrix interconnects the configurable functional blocks. The global interconnect matrix provides for routing any combination of signals entering the matrix to any configurable functional block, up to and including the maximum number (m) of inputs of a configurable functional block. Each configurable functional block includes a product term array connected to the m inputs. The product term array can perform a logical AND of up to m bits. A compare term array is also connected to the m inputs. The compare term array can perform an identity compare of up to m/2 bits. A number n of macro cells are provided in each configurable functional block wherein the number n is less that the number m. An allocation circuit allocates the outputs of the compare term array and the product terms to a macro cell, any compare term being allocable in place of a product term to the macro cell.

7 Claims, 3 Drawing Sheets

HIGH-SPEED COMPARATOR LOGIC FOR WIDE COMPARES IN PROGRAMMABLE LOGIC DEVICES

BACKGROUND OF THE INVENTION

1. Technical Field

The present invention relates to data processing system integrated-circuit chips, and more particularly to programmable logic devices.

2. Background Art

Programmable logic devices are integrated-circuit chips on which large numbers of logical AND and logical OR circuits are fabricated capable of being interconnected through instructions that can be varied to suit the user's needs. Depending upon the manufacturer, these devices may be referred to as a Programmable Logic Array (PLA TM ), a Programmable Array Logic (PAL) or a Programmable Logic device (PLD). PLDs devices are in the 300- to 500-gate density. The 22V10 is a PLD manufactured by Intel, AMD, and other companies.

Recently, a family of devices called Field Programmable Gate Arrays with a density of 5,000–10,000 gates have been developed. The lower the density, the faster the device can operate; that is, a faster Time Propagation Delay (TPD) through the device. As the density of the devices increases, however, the TPD becomes larger and larger for a given technology.

It is desirable to have a device that keeps the best features of the smaller devices, i.e., the predictability, the high performance, and the lower cost while approaching the density and the richness of features of higher-end devices. Therefore, in between the high-density, slower devices and the lower density, faster devices a family of devices called Complex PLDs have been developed, which are basically a number of small PLDs in one package. A complex PLD known as the Intel iFX780 TM has eight blocks, each similar to a small PLD, all connected to a global interconnect matrix so that a large number of I/O signals are available on a bus. Each of the eight blocks is similar to a conventional PLD. Each has a fan-in of 24 and a fan-out of 10, with programmable features. Each of the eight blocks takes from the matrix the signals that it needs and can produce up to 10 outputs that are made available at device pins. This results in a high-density package pin count of up to 132 pins.

In many logic design applications using a complex PLD, a comparison of two words having a large number of bits is necessary, such as match a fetch address with the contents of a cache directory. The speed at which this comparison is performed is critical, since the purpose of a cache is to improve memory access response time. Too slow a time propagation delay through the compare circuit would defeat this purpose.

It is therefore an object of the present invention to provide a high-speed wide compare logic in a programmable logic device.

SUMMARY OF THE INVENTION

Briefly, the above object is accomplished in accordance with the present invention by providing a programmable gate array comprising:

a plurality of configurable functional blocks;

each configurable functional block having a number (m) of inputs thereto;

first means for providing a global interconnect matrix, said first means being connected to said plurality of configurable functional blocks;

said first means including routing means for selectively routing any combination of signals entering said first means to any configurable functional block, up to and including said maximum number (m) of inputs of said configurable functional block;

said configurable functional block including second means for generating product terms, said second means being connected to said (m) inputs;

said second means including third means for performing a logical AND of up to m bits;

fourth means connected to said m inputs;

said fourth means including fifth means for performing an identity compare of up to m/2 bits;

sixth means for providing a logical output of said programmable gate array, said sixth means including a number (n) of macro cells; and, seventh means for allocating the outputs of said fourth means and said product terms in one macro cell of said macro cells, any compare term being allocable in place of a product term in said one macro cell.

The advantage of applicant's invention is that the identity compare is generated at the output of the local AND array, so it is generated similarly and in parallel with a product term, which means that it is generated prior to the OR plane. An allocation circuit is utilized so that if a particular product term output is not being used, it can be rerouted and used by other macro cells. The compare term is therefore directed to the OR plane of all of the macro cells so that the compare term can replace one of the product terms in a logical equation.

A further advantage of the invention is the ability to do a wide and fast compare and feed it into the OR plane of a standard programmable logic architecture allowing the user to do compare AND, or compare OR, or compare AND/OR logic all within the time propagation delay of the device. In order to do this function by conventional means would involve going through the logic array at least twice if not three times, thus incurring two to three times the time propagation delay of the device.

DESCRIPTION OF THE DRAWINGS

The foregoing and other objects, features, and advantages of the invention will be apparent from the following more particular description of the preferred embodiment of the invention as illustrated in the accompanying drawings, wherein.

DESCRIPTION OF THE PREFERRED EMBODIMENT

Figure 1:
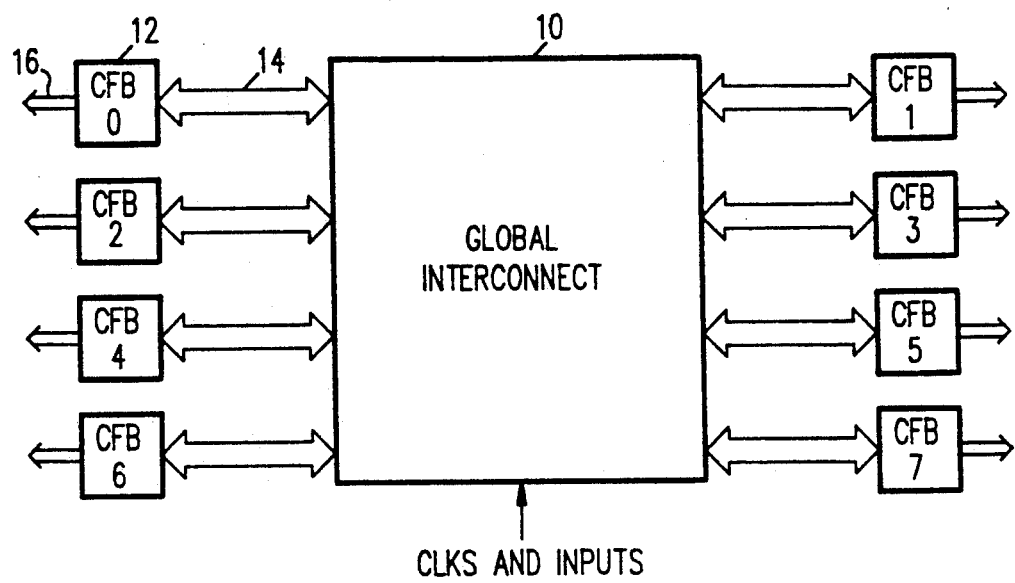
FIG. 1 is a functional block diagram of each of the major components of a programmable logic device in which the present invention is embodied.

Refer to FIG. 1, which is a functional block diagram of a field programmable gate array in which the present invention is embodied. The array is comprised of eight configurable-function blocks (CFB0-CFB7) linked together by a 100% connectable global interconnect (10). Each CFB (12) is connected to the global interconnect by a bus (14) comprised of 24 lines. The output (16) of each CFB (12) is connected to 10 output pins. The detailed logic of a CFB is shown in FIG. 2.

Figure 2:
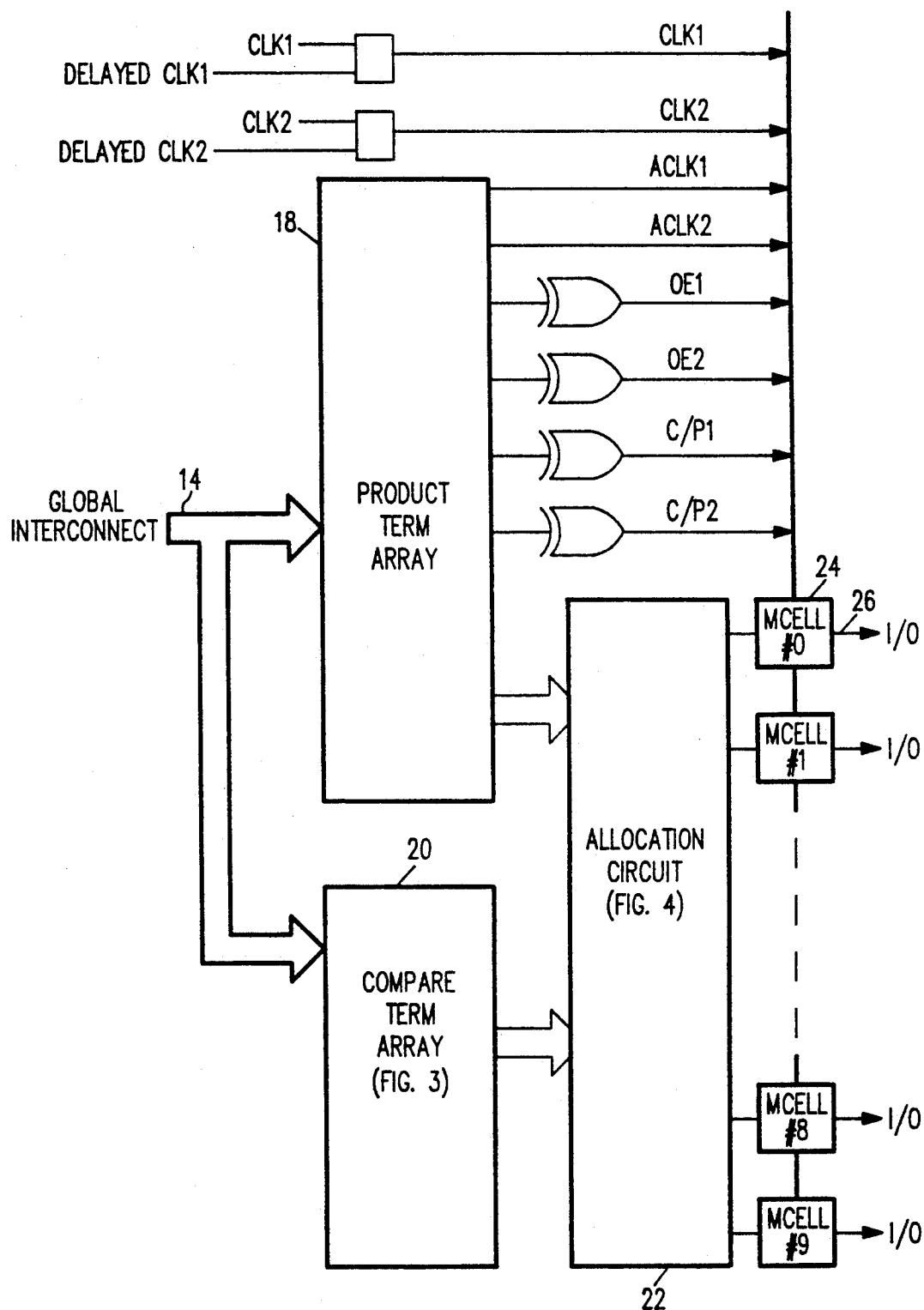
FIG. 2 is a more detailed block diagram of a configurable function block (CFB) shown in FIG. 1.

Refer to FIG. 2. The global interconnect is connected (14) to a product term array (18) and a compare term array (20). The product term array generates 66 product terms which drive the allocation circuit (22).

The compare term array (20) is capable of doing an identity compare of up to 12 bits, since 24 signals from the global interconnect are available. When less than 12 bits are being compared, then other signals available on the global interconnect bus can be used in equations. For example, doing an 8-bit compare leaves 8 other signals (24 minus 16 equals 8). The bits being compared may also be used to implement sum of product (SOP) logic in parallel with the compare function.

The outputs of the allocation circuit (22) drive ten macro cells (24), MCELL#0-MCELL#9. The outputs (26) of the macro cells provide the 10 outputs of the CFB.

Figure 3:
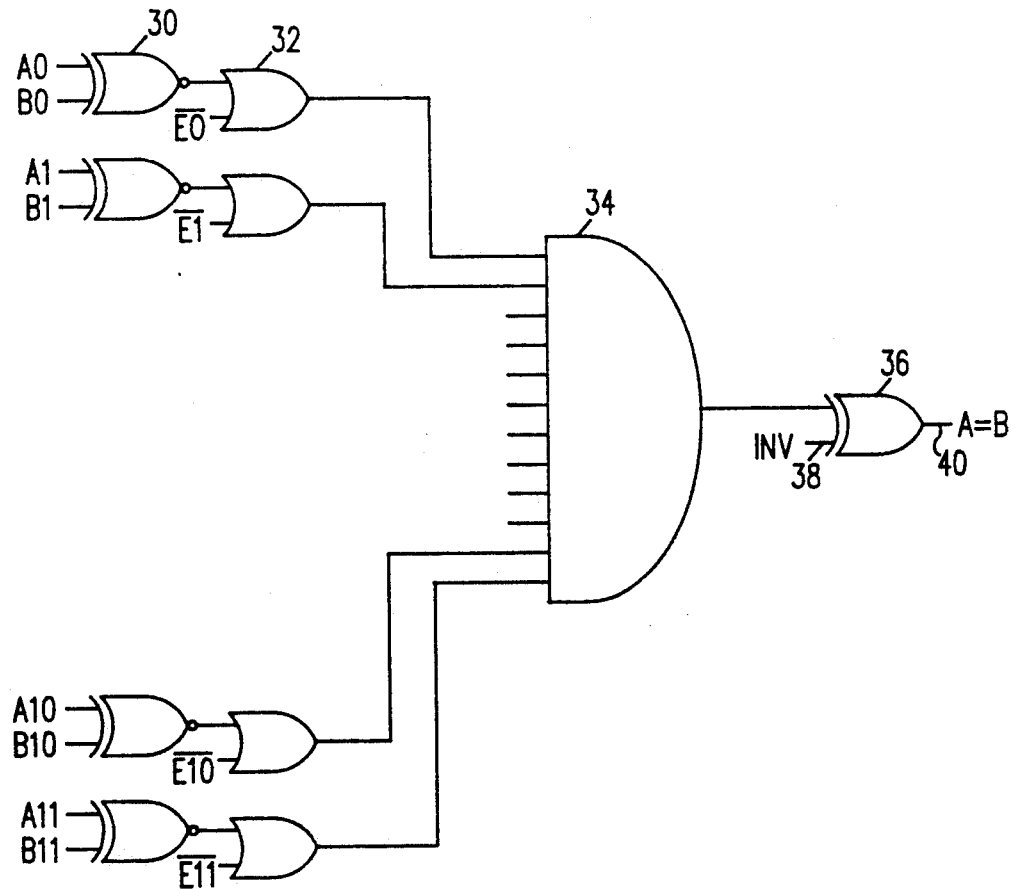
FIG. 3 is a more detailed functional block diagram of the compare term array shown in FIG. 2.

The compare term array is shown in more detail in FIG. 3. The comparator circuit can do an identity compare of a first 12-bit word (A0-A11) and a second 12-bit word (B0-B11). In the embodiment shown, the number of bits that can be compared is limited by the fan-in of the CFB, and since the fan-in is 24 signals, a 12-bit comparator is the maximum implementation possible.

The first two bits, A0 and B0 of each word to be compared are placed on the input to an exclusive OR (30). If the two input bits match, the output of the exclusive OR (30) will be negative. This output is fed to an NAND circuit (32). If the control bit (E0) is negative, the output of the NAND will be positive. The control bits (E0-E11) act as a mask so that words smaller than 12 bits can be compared. Similar logic is provided for the remaining bits. The output of all of the NAND circuits (32) are fed to an AND circuit (34). If a match is detected for all 12 of the exclusive OR circuits (30), then an output from the AND (34) causes an output from the exclusive OR (36) at the output thereof (40). The INV (38) input to the exclusive OR (36) allows the generation of an inverted output.

Figure 4:
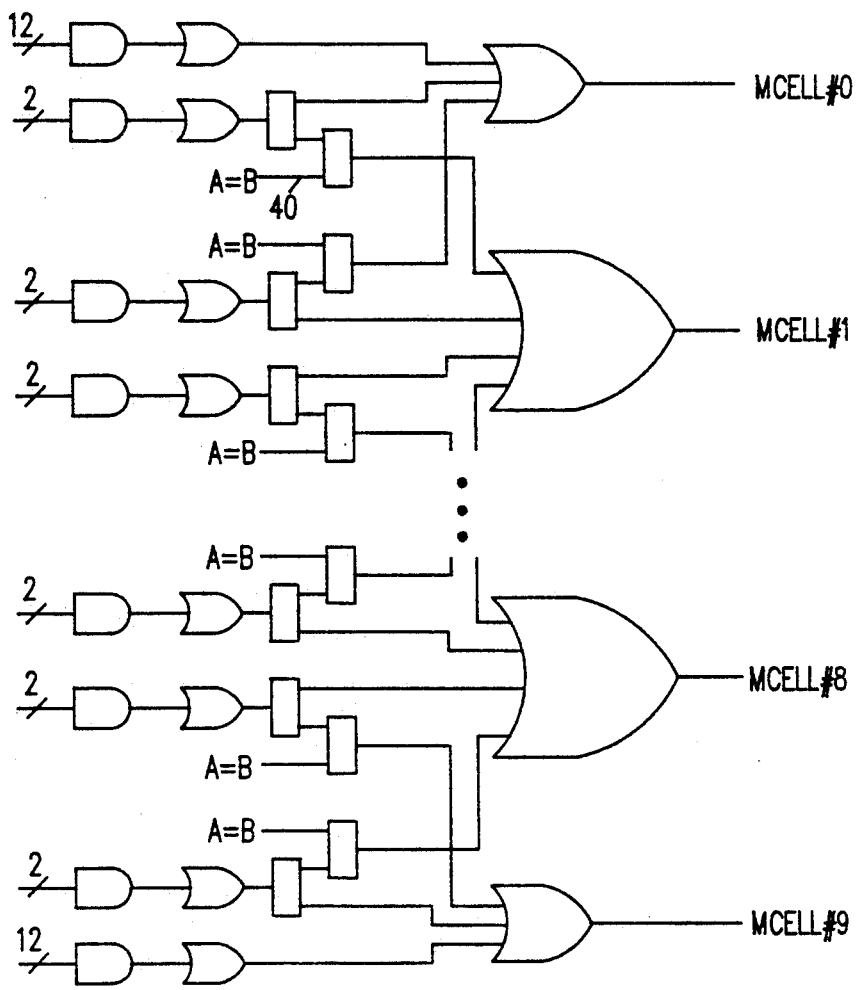
FIG. 4 is a more detailed block diagram of the allocation circuit shown in FIG. 2.

The allocation circuit (22) of FIG. 2 is shown in more detail in FIG. 4. At least four product terms (P-terms) are provided for each macro cell. The P-terms are grouped in sets of two product terms each, and there are two P-term sets per macro cell. Each macro cell may have product terms routed from adjacent macro cells in order to increase the total number of P-terms to a maximum of eight for a macro cell. Macro cells 0 and 9 have access to an extra product term set that allows an increase of up to 16 P-terms. The outputs of the comparator circuit (A=B) may be allocated in place of a P-term set in any one of the macro cells.

Figure 5:
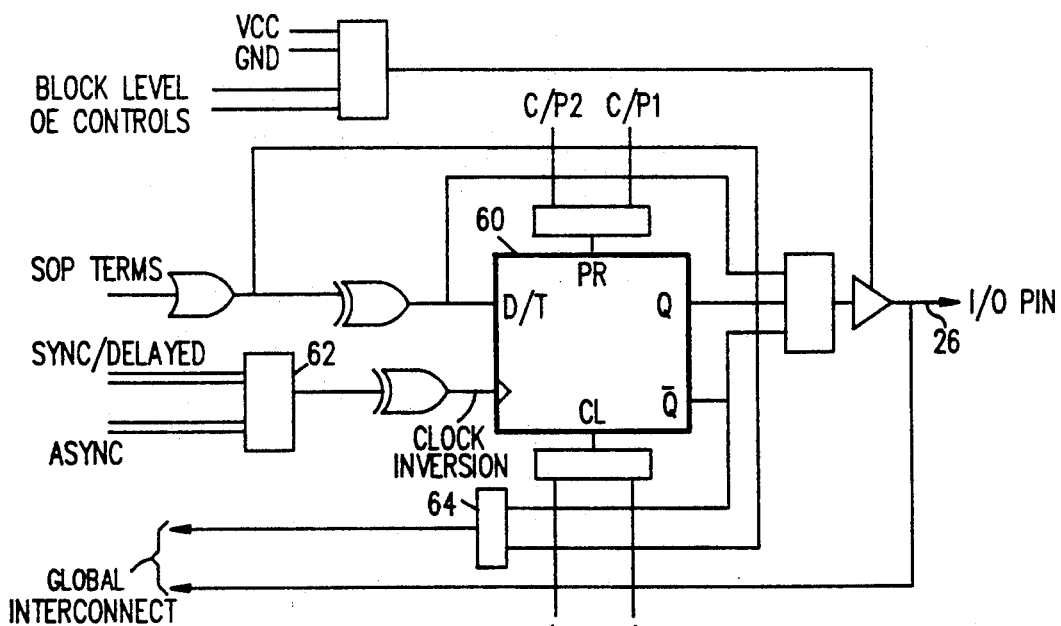
FIG. 5 is a more detailed functional block diagram of a macro cell shown in FIG. 2.

Refer now to FIG. 5, which is a block diagram of one of the macro cells (24) shown in FIG. 2. There are three clocking options available for every macro cell, synchronous (CLK1, CLK2), delayed (delayed CLK1 and delayed CLK2) and asynchronous (ACLK1 and ACLK2). Additional controls are the output enables (OE1 and OE2) and two asynchronous clear/preset control terms (C/P1 and C/P2).

There is a control bit that enables an open drain output option for each macro cell I/O pin. This allows more complex equations to be implemented by using multiple open drain outputs with an externally-supplied pull-up resistor to emulate an additional OR plane that ORs together the I/O pins of the macro cells. A toggle flip-flop (60) is set by the sum of product (SOP) term from the allocation circuit (22) shown in FIG. 2. The clock for the toggle (60) is selected (62) from among the three clock controls described above. The I/O pin (26) can be configured either as an input or an output and is fed back to the global interconnect (10) shown in FIG. 1. Also provided are feedback paths (64) for either the sum of product terms or the inverted output of the toggle (62).

While the invention has been particularly shown and described with reference to preferred embodiments thereof, it will be understood by those skilled in the art that the foregoing and other changes in form and detail may be made therein without departing from the scope of the invention.

What is claimed is:

1. A programmable gate array comprising:
a plurality of configurable functional blocks;
each configurable functional block having a maximum number (m) of inputs thereto;
first means for providing a global interconnect matrix, said first means being connected to said plurality of configurable functional blocks;
said first means including routing means for selectively routing any combination of signals entering said first means to any configurable functional block, up to and including said maximum number (m) of inputs of said configurable functional block;
said configurable functional block including
second means for generating product terms, said second means being connected to said (m) inputs;
said second means including third means for performing a logical AND of up to m bits on said m inputs;
fourth means connected to said m inputs;
said fourth means including fifth means for performing an identity compare of up to m/2 bits;
sixth means for providing a logical output of said programmable gate array, said sixth means including a number (n) of macro cells; and,
seventh means for allocating the outputs of said fourth means and said product terms in one macro cell of said macro cells, any compare term being allocable in place of a product term in said one macro cell.

2. The programmable gate array of claim 1 wherein said number (m) of inputs to each said configurable functional block is equal to 24 and said a number n of macro cells is equal to 10.

3. The programmable gate array of claim 1 wherein said number n is equal to or less than said number m.

4. A programmable gate array comprising:
a plurality of configurable functional blocks;
each configurable functional block having a maximum number (m) of inputs thereto;
a global interconnect matrix connected to said plurality of configurable functional blocks;
said global interconnect matrix including routing means for selectively routing any combination of signals entering said matrix to any configurable functional block, up to and including said maximum number (m) of inputs of said configurable functional block;
said configurable functional block including
a product term array connected to said m inputs;

said product term array including means for performing a logical AND of up to m bits on said m inputs;
a compare term array connected to said m inputs;
said compare term array including means for performing an identity compare of up to m/2 bits on said m inputs;
a number n of macro cells; and,
allocation means for allocating the outputs of said compare term array and said product terms in one macro cell of said macro cells, any compare term being allocable in place of a product term in said one macro cell.

5. The programmable gate array of claim 4 wherein said number (m) of inputs to each said configurable functional block is equal to 24 and said a number n of macro cells is equal to 10.

6. The programmable gate array of claim 4 wherein said number n is equal to or less than said number m.

7. A method of connecting a plurality of configurable functional blocks in a programmable gate array; each configurable functional block having a maximum number (m) of inputs thereto;
a number n of macro cells wherein said number n is less that said number m;
comprising the steps of:
A. selectively routing any combination of signals entering said global interconnect matrix to each configurable functional block, up to and including said maximum number (m) of inputs of said configurable functional block;
B. generating product terms from said m inputs by;
C. performing a logical AND of up to m bits on said m inputs;
D. performing an identity compare of up to m/2 bits on said m inputs to generate compare terms; and,
E. allocating one of said compare terms and one of said product terms to one macro cell of said n macro cells, for each of said n macro cells any compare term being allocable in place of any product term.

* * * * *